United States Patent
Morf

(10) Patent No.: US 8,440,978 B2
(45) Date of Patent: May 14, 2013

(54) METHOD AND APPARATUS FOR MULTI-LAYERED HIGH EFFICIENCY MEGA-VOLTAGE IMAGER

(75) Inventor: Daniel Morf, Irchel (CH)

(73) Assignee: Varian Medical Systems International AG, Zug (CH)

( * ) Notice: Subject to any disclaimer, the term of this patent is extended or adjusted under 35 U.S.C. 154(b) by 0 days.

(21) Appl. No.: 12/910,060

(22) Filed: Oct. 22, 2010

(65) Prior Publication Data

US 2012/0097858 A1   Apr. 26, 2012

(51) Int. Cl.
*H01L 27/146* (2006.01)

(52) U.S. Cl.
USPC .................................................... 250/370.09

(58) Field of Classification Search .. 250/363.01–363.1, 250/370.01–370.15; 378/98.8
See application file for complete search history.

(56) References Cited

U.S. PATENT DOCUMENTS

| | | | | |
|---|---|---|---|---|
| 5,138,167 | A * | 8/1992 | Barnes | 250/370.01 |
| 6,285,740 | B1 * | 9/2001 | Seely et al. | 378/98.9 |
| 6,868,138 | B2 * | 3/2005 | Clinthorne et al. | 378/98.8 |
| 7,573,040 | B2 * | 8/2009 | Tkaczyk et al. | 250/370.09 |
| 7,613,274 | B2 * | 11/2009 | Tkaczyk et al. | 378/5 |
| 7,671,342 | B2 | 3/2010 | Bani-Hashemi et al. | |
| 2002/0149305 | A1 * | 10/2002 | Danielsson et al. | 313/105 CM |
| 2005/0201518 | A1 * | 9/2005 | De Groot | 378/98.8 |
| 2006/0151708 | A1 * | 7/2006 | Bani-Hashemi et al. | 250/370.11 |
| 2007/0025513 | A1 * | 2/2007 | Ghelmansarai | 378/98.8 |
| 2007/0223654 | A1 * | 9/2007 | Aufrichtig et al. | 378/116 |
| 2008/0011960 | A1 * | 1/2008 | Yorkston et al. | 250/370.09 |
| 2008/0191138 | A1 * | 8/2008 | Kastalsky et al. | 250/361 R |
| 2010/0320556 | A1 * | 12/2010 | Tredwell | 257/443 |
| 2011/0155898 | A1 * | 6/2011 | Burr et al. | 250/252.1 |

* cited by examiner

*Primary Examiner* — Kiho Kim

(57) ABSTRACT

A multi-layered mega-voltage digital imager is disclosed. In one embodiment, the radiation to particle conversion and particle to electricity conversion is paired as a modular entity. The entity is replicated on top of each other as a layered unit to build an imager with increased resolution and efficiency. Due to this paired replication, sub-images from each replicated pair may be selectively combined and processed to enhance the quality of the image. By varying and adding components at each layer, a different dose rate, and increased resolution, energy sensitivity and efficiency are achieved. The multilayered approach is cost effective and removes problems associated with traditional high efficient MV imagers used for high energy radiations.

59 Claims, 7 Drawing Sheets

Exemplary Computer System 700

METHOD AND APPARATUS FOR MULTI-LAYERED HIGH EFFICIENCY MEGA-VOLTAGE IMAGER

BACKGROUND OF THE INVENTION

Advances in medical imaging have largely paralleled the growth of digital technology. Through digital technology, it is now feasible to gather, store, analyze and search large amounts of information at a rapid pace. Enhanced imaging and image post-processing have also been made possible by advances in digital technology, and are now commonly used in almost all modalities of medical imaging. Broadly, medical imaging incorporates radiology, nuclear medicine, endoscopy, investigative radiological sciences, thermography, medical photography and microscopy.

Radiology is the branch of medical science dealing with medical imaging for the purpose of diagnosis and treatment. The practice of radiology often involves the usage of X-ray machines or other radiation devices to perform the diagnosis or administer the treatment. Other practices of radiology employ techniques that do not involve radiation, such as magnetic resonance imaging (MRI) and ultrasound. As a medical field, radiology can refer to two sub-fields, diagnostic radiology and therapeutic radiology.

Diagnostic radiology is concerned with the use of various imaging modalities to aid in the diagnosis of disease or condition. Therapeutic radiology or radiation oncology uses radiation to treat diseases such as cancer through the application of radiation to targeted areas.

Newer technology and advanced techniques allow for improved image collection with the application of computerized tomography (CT) to medical imaging techniques. Conventional medical imaging processes involving CT scans will produce a series of 2-dimensional images of a target area which are subsequently combined using computerized algorithms to generate a 3-dimensional image of the target area. While CT can generate much more detailed images of soft tissues, it also exposes the target area (and thus, a patient) to more ionizing radiation, which may be potentially harmful or otherwise undesirable.

A typical configuration for a radiology device includes a radiation source for emitting the radiation (e.g., X-rays) used for imaging and one or more imaging devices corresponding to a radiation source for receiving incoming radiation after passing through the target volume. The beams collected by the imagers are subsequently used to generate a display (i.e., one or more images) of the targeted volume.

Generally, the imager used for X-ray is usually of the scale of the size of the object being imaged. These imagers often comprise integrated circuits in the form of amorphous-silicon (a-Si) thin film transistor (TFT) arrays. Among various technologies that have been developed based on amorphous silicon TFT arrays, the most widely used ones are "indirect detectors." These detectors are based on amorphous silicon TFT/photodiode arrays coupled to radiation scintillators (e.g., X-ray scintillators). Scintillators are detectors of radiation through their inherent capability of converting incident radiation into photons. The amount of conversion of X-ray radiation photon to light photon is measured as the efficiency of the scintillator. The efficiency of the scintillator is indicative of the amount of radiation the patient has to be exposed to get a certain quality of the image. If the efficiency is higher, the same quality of image can be obtained with relatively less radiation exposure to the patient.

Radiation dosages determine the amount of radiation exposure to the patient. Generally, diagnostic imaging involves less dosage than therapeutic imaging. Also the radiation applied is classified in terms of energy. Kilo-voltage (KV) imaging involves less energy than (mega-volt) MV imaging. The efficiency of the scintillator is also related to the amount of energy in the radiation, in other words whether it is a KV radiation or MV radiation. For example, a typical X-ray tube can generate 10 to 150 KV (KV) of energy. In radio-therapy, electrons/gamma radiation devices can produce about 1-100 MV (MV) of energy. Since MV radiation involves higher energy radiation photons, the probability of interaction with matter is lower.

Several solutions have been proposed to increase the efficiency of the scintillators used in MV imaging. These include making the scintillator wider or thicker or designing a segmented scintillator. Unfortunately, thick and segmented scintillators are very expensive to build and can suffer from performance problems. For example, increasing the thickness of the scintillator also leads to degraded light performance due to degradation of signal to noise ratio (SNR). Thicker scintillators also suffer degradation in resolution due to beam divergence. Beam Divergence is an angular measure which results in an increase in beam diameter which correlates with increasing distance from the optical aperture of emergence. Due to its overall thickness, the collection and distribution of photons which should represent the image suffers as they tend to diverge. Segmented scintillators also suffer from lower resolutions and are limited for usage at one specific source-imager distance—thereby resulting in limited image data acquisition distances and methods.

SUMMARY OF THE INVENTION

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

An embodiment of the present invention proposes a more efficient mega-volt imager, associated with high energy radiographic imaging or fluoroscopy. Whereas typical imagers deploy a single scintillator and a single detector, albeit of varying thickness and resolution, an embodiment of the present invention includes a modular solution where several paired layers of scintillators and particle detectors are employed on top of each other to produce a multi-layer imager. In an embodiment, "image layers" with different properties are combined into one imager. Scalable efficiency is achieved and by virtue of using a light transparent top layer, improvements to light field to X-ray field exposure matching or light field to other radiation field exposure matching is achieved, which is critical to radiation therapy.

In another embodiment, multiple image capture points are used corresponding to the availability of different layers, whereby captured images from various object distances could be combined into a single image. Furthermore, an anti-scatter grid can be used to control the effects of beam scattering. By changing the sensitivity to particles at different layers, the same imager could be used for different particles and not just for photons.

By comprising different filters or build-up materials in different layers, layers could be made sensitive to different energy ranges which allow acquiring images with different energy response. Processing these images can improve image quality. This approach allows, for instance, the ability to filter out the high energy portion of the received energy spectra which does not contain useful information. Such an approach also enables the construction of an energy discriminating high energy imager.

BRIEF DESCRIPTION OF THE DRAWINGS

The accompanying drawings are incorporated in and form a part of this specification. The drawings illustrate embodiments. Together with the description, the drawings serve to explain the principles of the embodiments.

DETAILED DESCRIPTION

Figure 1:
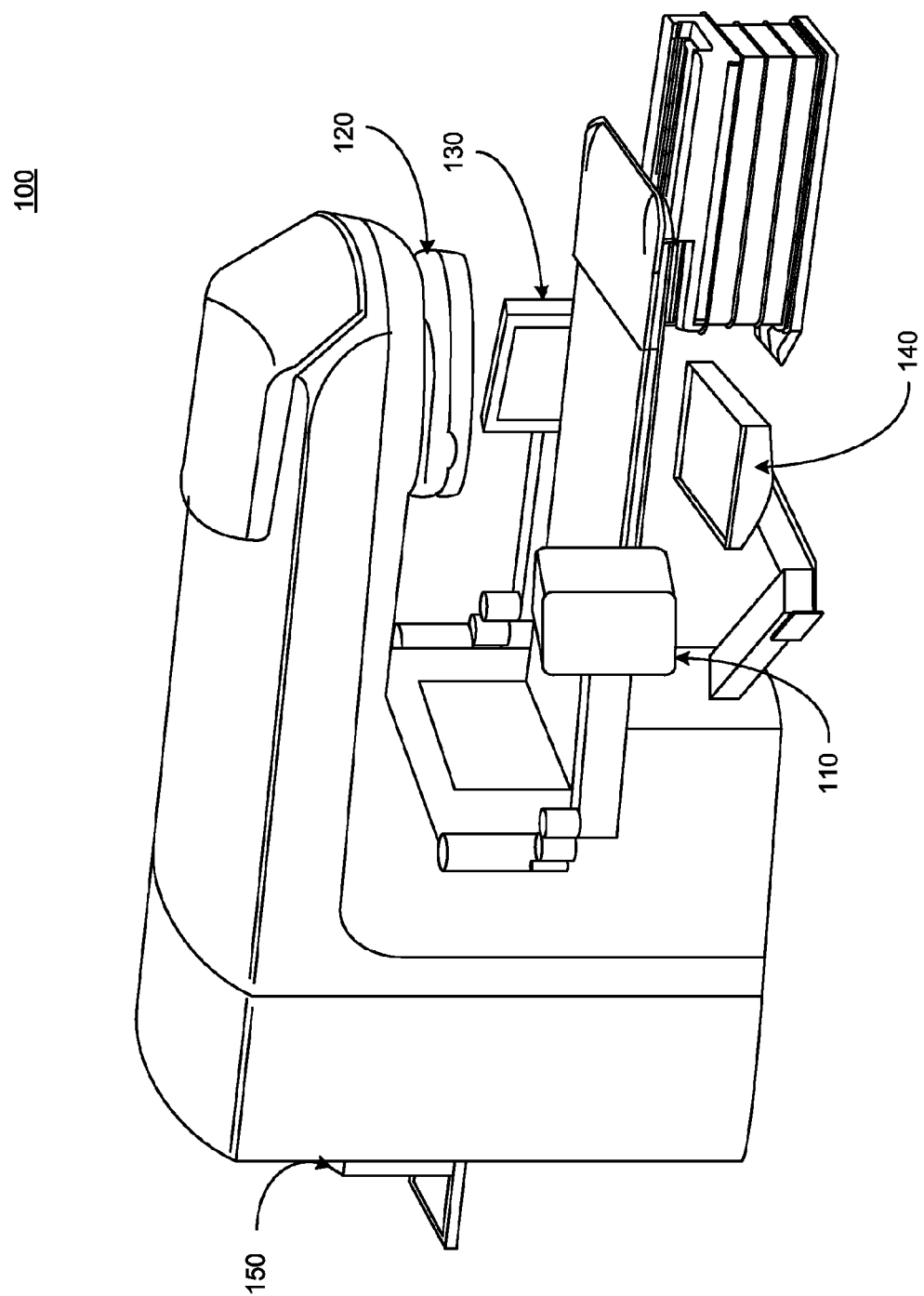
FIG. 1 depicts a high level block diagram of a digital imaging system, in accordance with various embodiments of the present invention.

Reference will now be made in detail to the preferred embodiments of the claimed subject matter, a method and system for the use of a reputation service provider, examples of which are illustrated in the accompanying drawings. While the claimed subject matter will be described in conjunction with the preferred embodiments, it will be understood that they are not intended to be limit to these embodiments. On the contrary, the claimed subject matter is intended to cover alternatives, modifications and equivalents, which may be included within the spirit and scope as defined by the appended claims.

Furthermore, in the following detailed descriptions of embodiments of the claimed subject matter, numerous specific details are set forth in order to provide a thorough understanding of the claimed subject matter. However, it will be recognized by one of ordinary skill in the art that the claimed subject matter may be practiced without these specific details. In other instances, well known methods, procedures, components, and circuits have not been described in detail as not to unnecessarily obscure aspects of the claimed subject matter.

Some portions of the detailed descriptions which follow are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer generated step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present claimed subject matter, discussions utilizing terms such as "storing," "creating," "protecting," "receiving," "encrypting," "decrypting," "destroying," or the like, refer to the action and processes of a computer system or integrated circuit, or similar electronic computing device, including an embedded system, that manipulates and transforms data represented as physical (electronic) quantities within the computer system's registers and memories into other data similarly represented as physical quantities within the computer system memories or registers or other such information storage, transmission or display devices.

Accordingly, embodiments of the claimed subject matter provide a method and system for building a high quantum efficient imager. The quantum efficiency, which represents the percentage of photons that interact with the imager of a conventional MV imager is around 2%. In one embodiment of this invention, the goal is to improve the quantum efficiency significantly.

Digital Imaging System

FIG. 1 represents a typical digital imaging system 100 which may be used to capture images to assist a physician in making accurate diagnoses. Digital imaging systems such as those depicted in FIG. 1 may include one or more radiation sources. As depicted, the digital imaging system 100 of FIG. 1 depicts a KV radiation source 110 and an MV radiation source 120, with corresponding detectors (detectors 130, 140, respectively). In alternate embodiments, one or more of the radiation sources may be operable to generate both KV and MV radiation. Likewise, a single detector may be used to receive radiation from both sources. According to these embodiments, one or more of the radiation and/or detectors may not be present. In still further embodiments, the imaging system 100 may also include a communicatively coupled computing device 150 for processing images and/or controlling and manipulating the device 100.

Radiation energy, such as X-rays, produced by the radiation source 110, 120 travel through a volume to be imaged and are detected (i.e., received) by a detector 130, 140. A corresponding image processing system obtains image data from the detector and prepares a diagnostic image on a display corresponding to the arrangement of the detection sites in the imager. The images may also be used for verifying and/or adjusting patient positioning on a therapy machine, for example. Additionally, the imaging system may also be used as a 2-dimensional dose measuring device (Dosimetry), which allows the verification of the accurate dose delivery of the therapy machine. In even more advanced applications the captured signals by the imaging system can be used to calculate the dose deposited in the patient.

Figure 2:
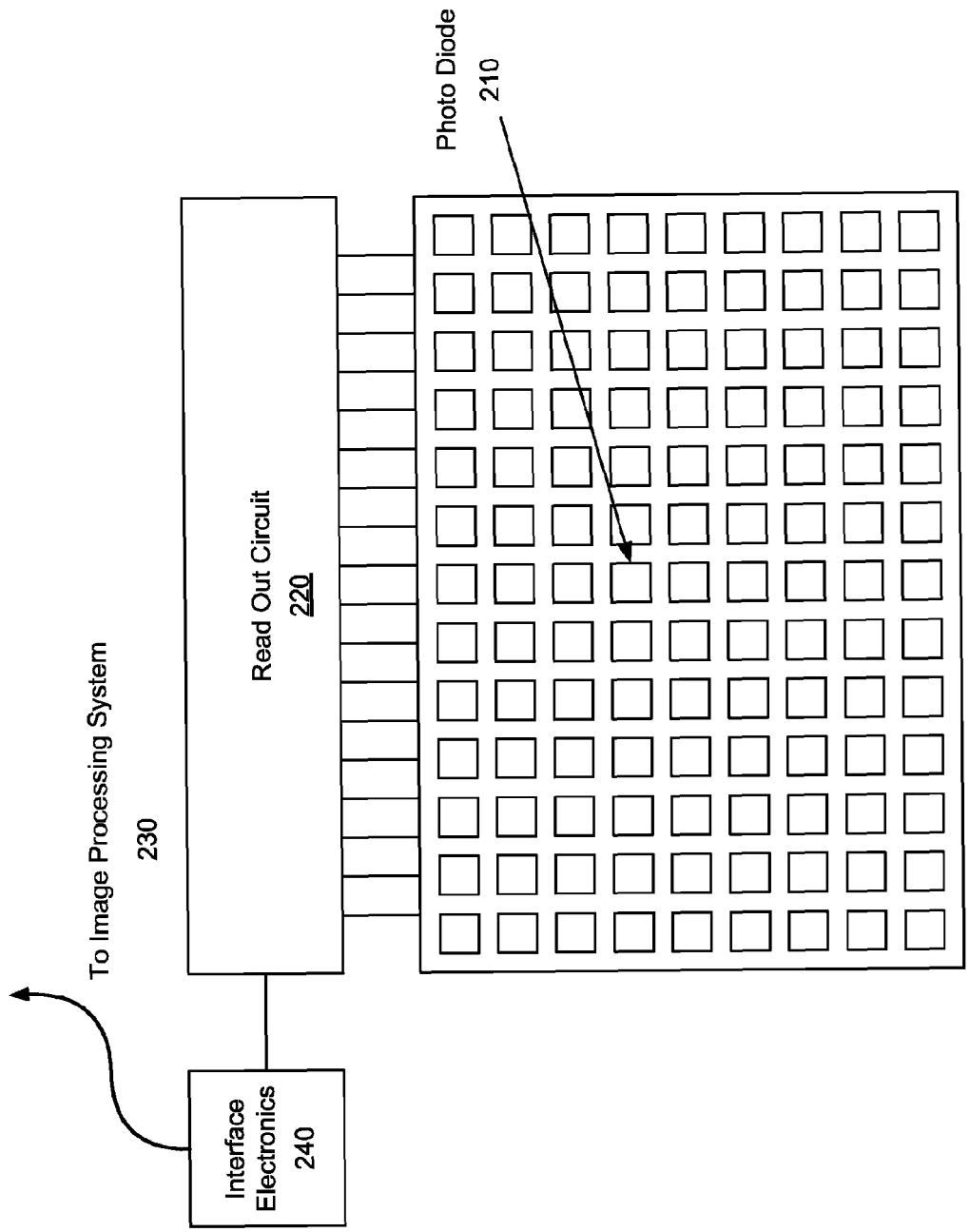
FIG. 2 is a high level diagram of the electronics involved in a digital imaging system, in accordance with various embodiments of the present invention.

FIG. 2 depicts a block diagram of the electronic portion of an image processing system in a digital imaging system. According to one embodiment, particles received in a detector (e.g., detector 130, 140 of FIG. 1) generate electron hole-pairs in the array of photo-diodes 210, accumulating charge which is stored in an intrinsic capacitor of the photo diodes 210. The accumulated charge carriers are subsequently fed pixel by pixel into a read out circuit 220. At a basic level, the presence and absence of photons (and in turn light) is detected by either the presence or absence of a flow of current in the photodiode. Such a pixel based electric behavior generates an image in the image processing subsystem 230.

According to some embodiments, the detector 130, 140 may be an amorphous silicon (a-Si) panel detector. Amorphous silicon is a type of silicon that is not crystalline in structure. Pixels which constitute the generated image may correspond to the pixels of the detector 130, 140. The detector pixels may be formed from amorphous silicon photodiodes which are connected to switches on the flat panel. Since photodiodes react to light photons, a scintillator is placed in front of the flat panel detector. In typical embodiments, the scintillators act as an absorber of X-rays and convert the X-ray radiation particles to visible light photons at energies that a layer of sensors is able to convert to charge carriers. In some embodiments, the sensors may be comprised of amorphous silicon (a-Si) photo-diode arrays. Alternatively, the sensors may be implemented as photo-diode arrays based on organic semiconductors, which convert the light photons into electron hole-pairs. In still further embodiments, the layer of sensors may also include amorphous silicon (a-Si) or organic semiconductor thin film transistors which enable the measurement of the charge corresponding to the electron hole-pairs in a readout circuit, such as an application specific integrated circuit (ASIC). Each pixel of the detector 130, 140 then, may comprise both a photo-diode as well as a thin film transistor. For high energy photons, a build-up plate consisting of, for example, copper is used to enhance the detective quantum efficiency (DQE) of the detector.

Detector Signal Sequence

Figure 3:
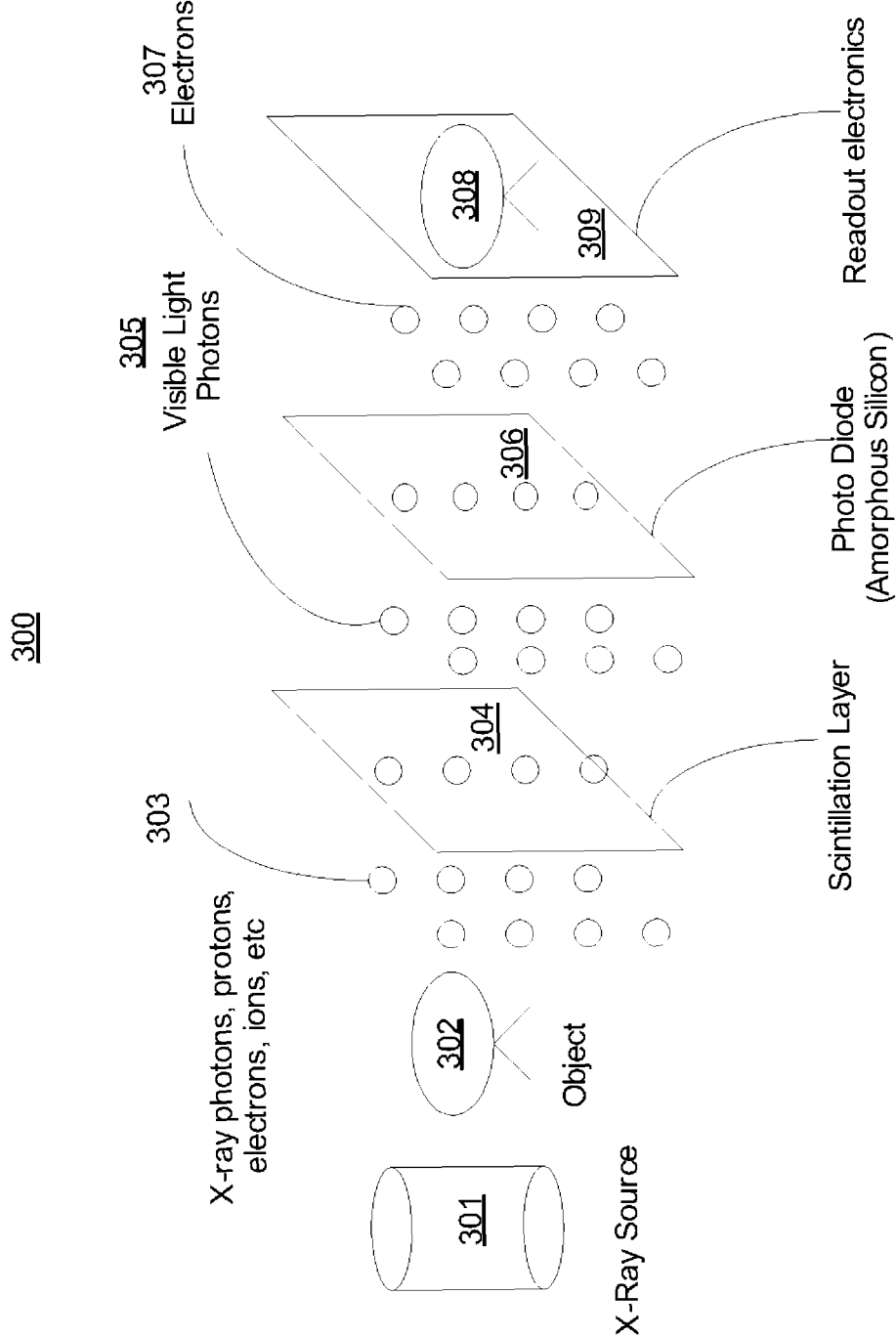
FIG. 3 is a diagram representing a typical flat panel detector signal sequence, in accordance with various embodiments of the present invention.

FIG. 3 depicts an illustration of an image detector signal sequence 300, in accordance with embodiments of the present invention. In one embodiment, the scintillator 304 receives X-rays from an X-ray source 301 and emits light of an intensity related to the amount of X-rays absorbed. X-ray source 301 sends a beam of X-ray photons through an object 302. X-ray photons 303 that are not absorbed by the object 302, strike a layer of scintillating material 304 that converts the x-ray photons into visible light photons 305. These photons then strike an array of photo-diodes 306 in a sensor layer, which converts the photons into electrons 307 that are stored in the intrinsic capacitance of the pixels in a layer of amorphous silicon 309. According to some embodiments, the sensor layer may include an amorphous silicon (a-Si) thin film transistor (TFT) array. The activated pixels generate electronic data that is transferred through the TFT array to a computing device, which can convert the transferred charge into a high quality image of the target 308. The image may be subsequently displayed on a computer monitor, or stored in memory or on a tangible computer readable medium.

Photo Diode Arrays

Figure 4:
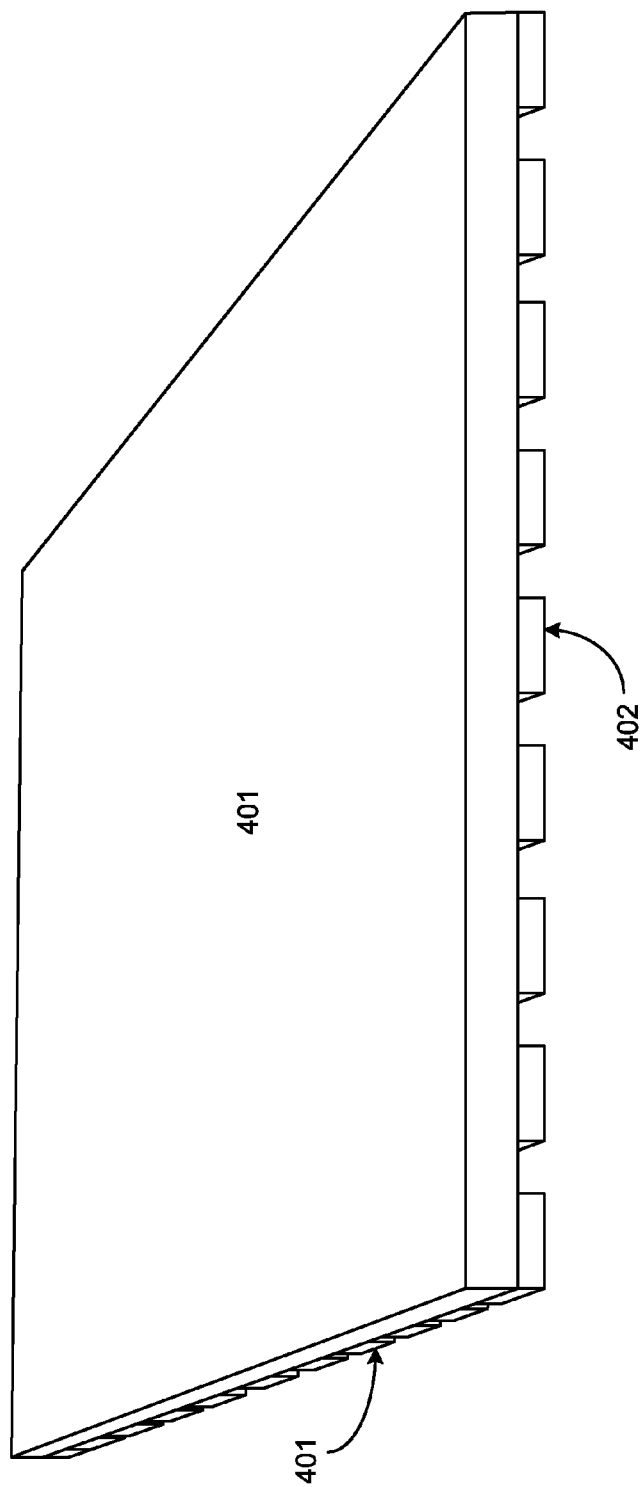
FIG. 4 is a diagram of a photo diode array and scintillator of current image detectors, in accordance with various embodiments of the present invention.

As illustrated in FIG. 4, a detector comprising a paired scintillator 401 and an array of a-Si photo-diodes 402 is depicted. Generally, the Detective Quantum Efficiency (DQE) of an imager is generally dependent on the energy of the radiation. When the radiation is high energy, the DQE of the imager falls. In one embodiment, the DQE of a MV Imager may be 2%. In order to increase the efficiency, the scintillation material has to be made thicker. With a lower DQE, higher doses of source radiation have to be applied to get a set quality of image. However, a higher radiation dose to a patient may be detrimental and is typically not preferred. Typically, that a patient be exposed to as little dose of radiation as possible is desired. Thus, increasing the DQE of the imager achieves the goal of maintaining image quality while reducing the radiation received by a patient, or alternatively, improves and increases image quality without exposing a patient to increased levels of radiation.

Figure 5:
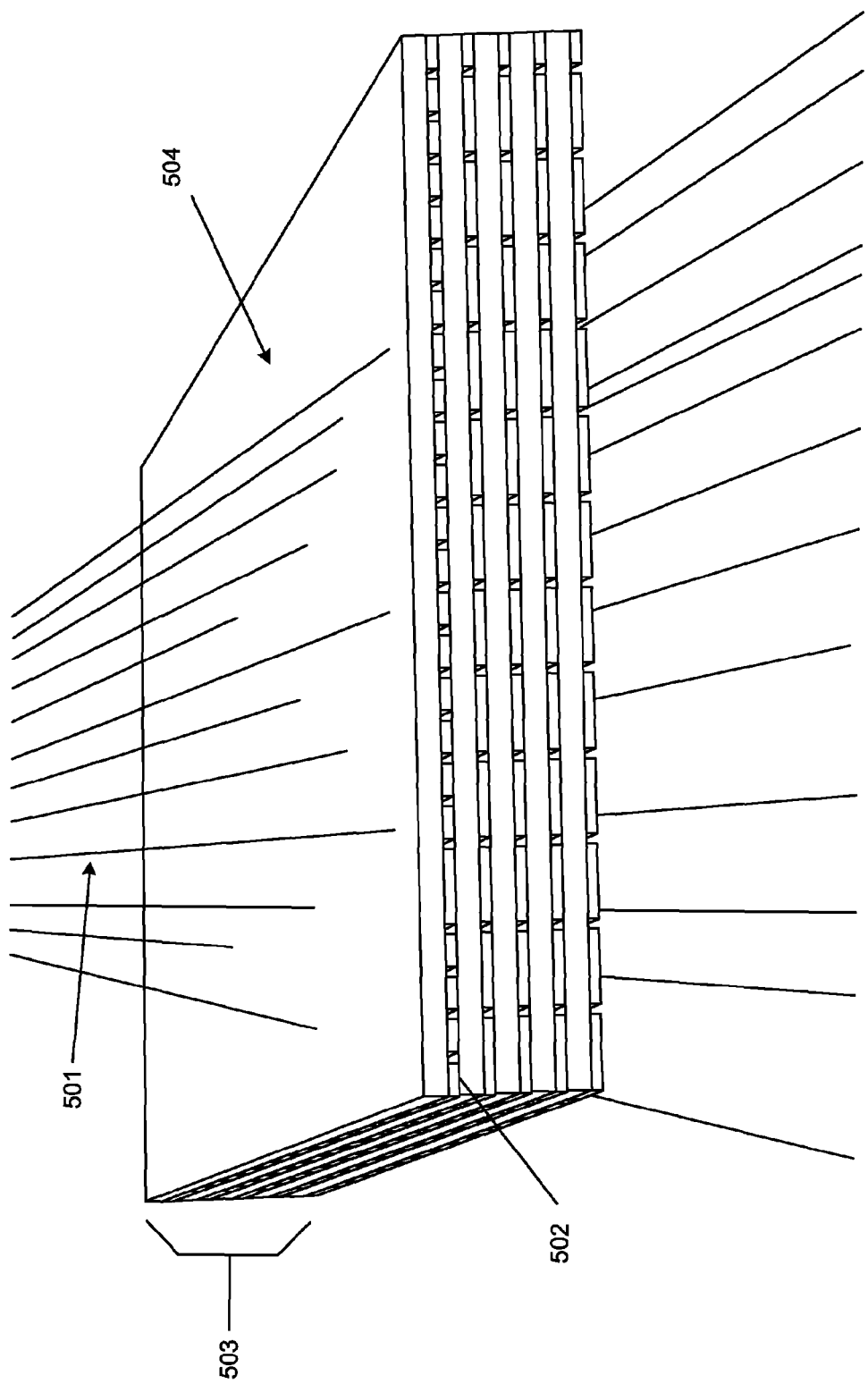
FIG. 5 represents a photo diode array and scintillator of an a-Si based image detector (multilayer), in accordance with various embodiments of the present invention.

An exemplary embodiment of the design of a detector according to the present invention is presented in FIG. 5. In one embodiment of this invention, multiple, modularly scalable layers (503) of the imager (scintillator 504 and photodiode array 502) are built on top of each other. In one embodiment, X-rays 501 are received incident to the top layer of the imager and travel through a series of scintillator and photodiode pairs, thereafter allowing for image capture processing. In an alternative embodiment, layers with different resolution of the pixel matrix may be used. For instance, the top layer could have double the resolution (502).

According to an alternate embodiment, an imager is provided with multiple layers having different energy sensitivities, respectively. For example, the top layer could be made sensitive to all energies, while the second layer could be made sensitive to a higher energy spectra by adding a filter between the two layers. Processing these images allows the acquisition of images which is sensitive to the lower energy photon. The lower energy spectrum of the photons typically contains more useful image information and hence improves image quality.

Figure 6:
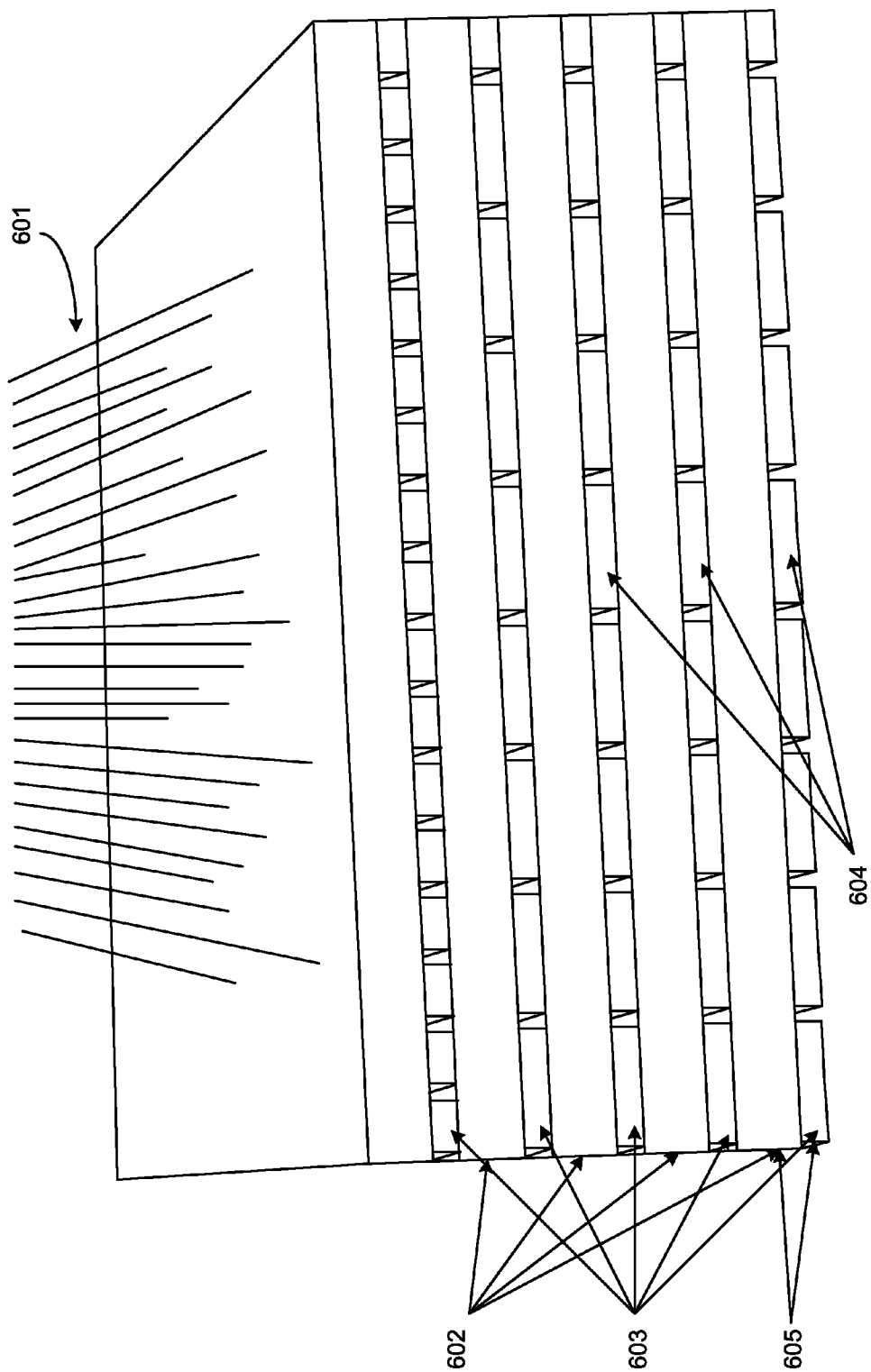
FIG. 6 represents a Multilayer image detector close-up view showing an example of changing resolution on one of the layers, in accordance with various embodiments of the present invention.

FIG. 6 represents a multilayer close-up view of an imager (e.g., the imager described above with respect to FIG. 5). X-rays 601 are received incident to the top layer. As presented, the various scintillating layers are represented in FIG. 6 as 602. Photo-diode arrays are depicted as 603. One scintillator and photo-diode array layer pair is depicted as 605. Photo-diodes 604 refers to peculiar diodes and may be configured to react to selected specialized particles only.

In one embodiment of the invention, the multi-layer detector combines the individual efficiencies of the single scintillator photo-diode pair to add up linearly and form one high efficient detector. A multi-layer imager (e.g., an imager having five layers) for example will combine the efficiency of each of the five layers to form a much more efficient composite imager. For example, a five layered imager having a 2% efficiency per layer may have a 10% efficiency according to embodiments of the present invention as described herein.

In further embodiments, each layered scintillator and photo-diode layer may also comprise a sub-imager. According to these embodiments, in order to restore resolution when combining the images from each layer, the sub-images are re-sampled and interpolated depending on the source to imager distance to achieve a compatible pixel matrix. Each sub-image from this embodiment may also optionally participate in the combination. Sub-images are selectively collected across the plurality of layered scintillators and photo-diode layers based on their position in the configuration. With a digital image available from each layer, an image processing unit can appropriately processes the images to improve the resolution.

In a still further embodiment of the invention, the top layer in the configuration is operable to be sensitive to light. According to this embodiment, a light field versus X-ray field verification is made possible. For example, the top layer may generate images solely from light photons. This image may be subsequently compared with the X-ray field image generated by another layer that is not light sensitive. Therefore, a comparison could be made using the images acquired from a top layer and from another layer. An alternative embodiment uses a light sensitive scintillator as the top layer. The efficacy of the scintillator to generate an accurate image depends on the relational generation of light photons from radiation photons, and on light photons to strike their pixels This way the light and the X-ray image could be captured by the same a-Si layer, allowing the images to be taken one after the other.

The acquisition of X-ray imaging via images generated from light photons advantageously allows the simultaneous and convenient comparison of images. Since the radiation dosage is often high for therapeutic sources during a radiation therapy procedure, a physician is able to cleanly delineate the exact area of exposure through benign light exposure. When the light exposure and X-ray exposure are very close, a physician can verify that the application of high doses of curative radiation will be restricted to the desired areas and is thereby able to limit the harmful effects of radiation to localized tissues with greater accuracy. While X-ray radiation has been used as an exemplary form of radiation, these procedures may be performed with and for any other source of radiation as well.

In another embodiment of the invention, a plurality of anti-scatter grids could be placed in between the plurality of layers. The anti-scatter grid may be positioned between the patient and the detector, for example, and used as a method of reducing scattered radiation by absorbing a portion of the scattered radiation in its lead plates. Scattering radiation generated in the target object (e.g., the patient) may be collected by the anti-scatter grid. Likewise, scatter produced in higher layers of the imager may also be collected by the anti-scatter grid to improve the collection of image data. While traditional solutions of having a thickened scintillator provide but one opportunity to place this anti-scatter grid, embodiments of the present invention provide almost as many opportunities for anti-scatter grid placement as the number of layers present.

It must be noted by those skilled in the art that whereas this invention has been described illustratively for X-ray radiation and X-ray photons which generate light photons, an embodiment of this invention may involve a plurality of radiation particles, including but not limited to electrons, photons, protons, ions, light photons or other particles of matter subject to future discovery which may generate a plurality of particles, including but not limited to electrons, photons, protons, ions, light photons or other particles of matter subject to future discovery. Nothing in the invention, as described, limits it to a particular radiation photon or striking particle. In an embodiment of the MV Imager, different particles may be subject to discovery in the same imager, in different layers.

In another embodiment of the invention, the layers of the MV imager may not be the same in terms of filtration, scintillation, resolution or any combination thereof. Filtration changes are implemented in one embodiment by use of anti-scatter grid between layers. Scintillation changes may be implemented in one embodiment as by using different types of materials, CsI versus GS2O2S for example. The changes could also be implemented by using different thicknesses or any combination of the thicknesses and materials. The resolution changes may be implemented in a plurality of layers by narrowing the pixels and increasing their number or any combination thereof. Such a variation could also be implemented between layers. In one embodiment, the change in resolution could be made in the direction of beam divergence. In this manner, the layers placed away from the radiation source, may be chosen to have more pixels for the same image size.

In another embodiment of the invention, the number of layers may be changed for the imager to be scalar. If a higher dose is required, the number of layers may be increased by modularly adding a plurality of layered pair of scintillator and photo-diode array. Similarly for a lower dose rate, the effective DQE of the imager may be reduced by modularly removing the layered pairs. In one embodiment of the invention, the same multilayer Imager may be used for low dose application (such as Cone Beam Computer Tomography) or high dose application such as Dosimetry.

Exemplary Computer System

Figure 7:
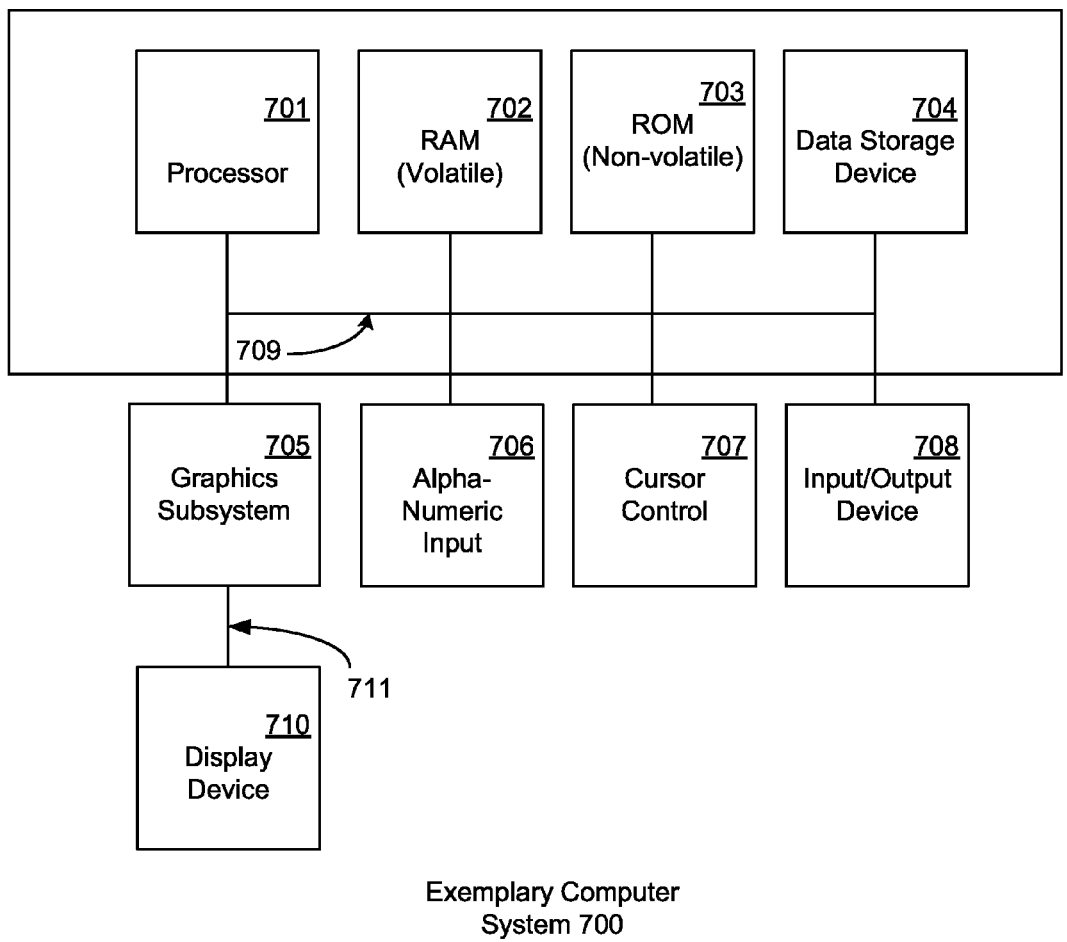
FIG. 7 depicts an exemplary computing environment, in accordance with embodiments of the present invention.

As presented in FIG. 7, an exemplary system 700 upon which embodiments of the present invention may be implemented includes a general purpose computing system environment, such as computing system 150 described above with respect to FIG. 1. In its most basic configuration, computing system 700 typically includes at least one processing unit 701 and memory, and an address/data bus 709 (or other interface) for communicating information. Depending on the exact configuration and type of computing system environment, memory may be volatile (such as RAM 702), non-volatile (such as ROM 703, flash memory, etc.) or some combination of the two.

Computer system 700 may also comprise an optional graphics subsystem 705 for presenting information to the computer user, e.g., by displaying information on an attached display device 710, connected by a video cable 711. According to embodiments of the present claimed invention, the graphics subsystem 705 may be coupled directly to the display device 710 through the video cable 711. A graphical user interface of an application for displaying images generated by a medical imaging device described above with respect to FIG. 1, and executing in the computer system 700 may be generated in the graphics subsystem 705, for example, and displayed to the user in the display device 710. In alternate embodiments, display device 710 may be integrated into the computing system (e.g., a laptop or netbook display panel) and will not require a video cable 711. In one embodiment, the processing of the image data acquired in the detectors 130, 140 to generate an image may be performed, in whole or in part, by graphics subsystem 705 in conjunction with the processor 701 and memory 702, with any resulting output displayed in attached display device 710.

Additionally, computing system 700 may also have additional features/functionality. For example, computing system 700 may also include additional storage (removable and/or non-removable) including, but not limited to, magnetic or optical disks or tape. Such additional storage is illustrated in FIG. 7 by data storage device 707. Computer storage media includes volatile and nonvolatile, removable and non-removable media implemented in any method or technology for storage of information such as computer readable instructions, data structures, program modules or other data. RAM 702, ROM 703, and data storage device 707 are all examples of computer storage media.

Computer system 700 also comprises an optional alphanumeric input device 706, an optional cursor control or directing device 707, and one or more signal communication interfaces (input/output devices, e.g., a network interface card) 709. Optional alphanumeric input device 706 can communicate information and command selections to central processor 701. Optional cursor control or directing device 707 is coupled to bus 709 for communicating user input information and command selections to central processor 701. Signal communication interface (input/output device) 709, also coupled to bus 709, can be a serial port. Communication interface 709 may also include wireless communication mechanisms. Using communication interface 709, computer system 700 can be communicatively coupled to other computer systems over a communication network such as the Internet or an intranet (e.g., a local area network), or can receive data (e.g., a digital television signal).

In the foregoing specification, embodiments have been described with reference to numerous specific details that may vary from implementation to implementation. Thus, the sole and exclusive indicator of what is the invention, and is intended by the applicant to be the invention, is the set of claims that issue from this application, in the specific form in which such claims issue, including any subsequent correction. Hence, no limitation, element, property, feature, advantage, or attribute that is not expressly recited in a claim should limit the scope of such claim in any way. Accordingly, the specification and drawings are to be regarded in an illustrative rather than a restrictive sense.

What is claimed is:

1. An image detection apparatus comprising:
  a modularly scalable plurality of image layers comprising a number of image layers, each of the plurality of image layers comprising:
    a converter layer configured to absorb radiation from a radiation source and convert the absorbed radiation into a plurality of particles;
    a sensor layer paired to the converter layer and configured to generate charged particles from the plurality of particles; and
  an electronic circuit for processing the charged particles generated by the sensor layers to generate a digital image,
  wherein the electronic circuit comprises a plurality of sub-imagers corresponding to the plurality of image layers, each of the plurality of sub-imagers being configured to generate a sub-image for the corresponding image layer;
  wherein the digital image is generated by combining a selection of a plurality of sub-images generated by the plurality of sub-imagers, the plurality of sub-images being selected based on positions of the plurality of image layers corresponding to the plurality of sub-images,
  further wherein the number of image layers is modularly scaled to correspond to a dosage of an application of the radiation source.

2. The apparatus of claim 1 wherein the plurality of image layers is arranged in a two-dimensional array.

3. The apparatus of claim 1 wherein the plurality of image layers is vertically stacked.

4. The apparatus of claim 1 wherein the radiation comprises X-ray radiation.

5. The apparatus of claim 1 wherein the charged particles comprise electron hole pairs.

6. The apparatus of claim 1 wherein at least one sensor layer of the plurality of image layers comprises a photo-diode array.

7. The apparatus of claim 1 wherein at least one sensor layer of the plurality of image layers comprises an amorphous silicon (a-Si) photo diode array.

8. The apparatus of claim 1 wherein at least one sensor layer of the plurality of image layers comprises an amorphous silicon (a-Si) transistor array.

9. The apparatus of claim 1, wherein at least one sensor layer of the plurality of image layers comprises an organic semiconductor photo diode array.

10. The apparatus of claim 1, wherein at least one sensor layer of the plurality of image layers comprises an organic semiconductor transistor array.

11. The apparatus of claim 1 wherein at least one converter layer of the plurality of image layers comprises a layer of scintillators.

12. The apparatus of claim 11 wherein the converter layer for a top layer of the plurality of image layers comprises a layer of scintillators.

13. The apparatus of claim 1 wherein at least one sensor layer of the plurality of image layers comprises an amorphous silicon (a-Si) thin film transistor array.

14. The apparatus of claim 1 wherein a sensor layer of the plurality of image layers is sensitive to light.

15. The apparatus of claim 1 wherein a converter layer of the plurality of image layers is sensitive to light.

16. The apparatus of claim 1 further comprising a plurality of anti-scatter grids.

17. The apparatus of claim 1 wherein the radiation from the radiation source is comprised of a plurality of particles, the plurality of particles consisting of at least one of the group of particles which includes: electrons, protons, ions and photons.

18. The apparatus of claim 1, wherein the electronic circuit comprises an application specific integrated circuit (ASIC).

19. The image detection apparatus of claim 1, wherein the plurality of is re-sampled and interpolated to restore a resolution when combining images from the plurality of image layers.

20. The image detection apparatus of claim 19, wherein the electronic circuit re-samples and interpolates the sub-images from the plurality of sub-imagers to generate the digital image.

21. The image detection apparatus of claim 20, wherein the electronic circuit selectively collects sub-images from the plurality of sub-imagers to re-sample and interpolate.

22. The image detection apparatus of claim 20, wherein the electronic circuit re-samples and interpolates the sub-images from the plurality of sub-imagers to achieve a pixel matrix used to generate the digital image.

23. The image detection apparatus of claim 1, wherein the radiation from the radiation source has a corresponding energy level.

24. The image detection apparatus of claim 23, further wherein the radiation from the radiation source a first image layer of the plurality of image layers is sensitive to radiation at a first energy level, and a second image layer of the plurality of image layers is sensitive to radiation at a second energy level different from the first energy level.

25. The image detection apparatus of claim 1, further wherein the converter layer in each of the plurality of image layers has a corresponding pixel resolution, and the pixel resolution of each converter layer is different from the pixel resolution of converter layers in other image layers of the plurality of image layers.

26. The image detection apparatus of claim 25, further wherein the pixel resolution of each of the plurality of converters varies to correspond with a beam divergence of the radiation beam.

27. The image detection apparatus of claim 1, further wherein the number of image layers comprising the plurality of image layers is modularly scaled to correspond to a dose rate of the radiation from the radiation source.

28. The image detection apparatus of claim 27, further wherein the number of image layers comprising the plurality of image layers is increased to correspond to a higher dose rate of the radiation from the radiation source.

29. The image detection apparatus of claim 28, further wherein the number of image layers comprising the plurality of image layers is reduced to correspond to a lower dose rate of the radiation from the radiation source.

30. The image detection apparatus of claim 1, wherein the image detection apparatus comprises a two-dimensional dose measuring device.

31. A method for generating an image in a digital imaging system comprising:
receiving an incident radiation beam in a modularly scalable plurality of vertically stacked image layers, each image layer being implemented to include a converter layer and a sensor layer;
for each image layer of the plurality of image layers,
converting, in the converter layer comprised in a top most image layer of the plurality of image layers, a portion of the incident radiation beam into a plurality of particles, the remaining portion of the incident radiation beam comprising pass through radiation;
generating, in the sensor layer comprised in the top most image layer, a plurality of charged particles from the plurality of particles;
receiving, in the converter layer comprised in an image layer below the top most image layer, the pass through radiation;
processing the pluralities of charged particles to generate a plurality of sub-images corresponding to each image layer of the plurality of image layers in an electronic circuit; and
determining a selection of sub-images from the plurality of sub-images based on positions of the image layers corresponding to the plurality of sub-images;
combining the selection of sub-images to generate a digital image in the electronic circuit,
wherein the number of image layers comprising the plurality of vertically stacked image layers is modularly scaled to correspond to a dosage of an application of the incident radiation beam.

32. The method of claim 31 wherein the incident radiation comprises X-rays.

33. The method of claim 31 further comprising reducing object scatter by implementing a plurality of anti-scatter grids.

34. The method of claim 31 wherein the pluralities of charged particles comprise pluralities of electron hole pairs.

35. The method of claim 31 wherein the incident radiation beam is comprised of a plurality of particles, the plurality of particles being comprised of at least one of the group of particles which includes: electrons, protons, ions and photons.

36. The method of claim 31 wherein at least one sensor layer of the plurality of image layers comprises a photo-diode array.

37. The method of claim 36, wherein the photo-diode array is an amorphous silicon (a-Si) photo diode array.

38. The method of claim 31 wherein the at least one of the plurality of converters comprises a plurality of scintillators.

39. The method of claim 31 wherein at least one sensor layer of the plurality of image layers comprises an amorphous silicon (a-Si) thin film transistor array.

40. The method of claim 31, wherein at least one sensor layer of the plurality of image layers comprises an organic semiconductor photo diode array.

41. The method of claim 31, wherein at least one sensor layer of the plurality of image layers comprises an organic semiconductor transistor array.

42. The method of claim 31 wherein the electronic circuit comprises an application-specific integrated circuit (ASIC).

43. The method of claim 31, wherein combining the plurality of sub-images to generate a digital image in an electronic circuit comprises re-sampling and interpolating the plurality of sub-images.

44. The method of claim 43, wherein the plurality of sub-images are selectively collected by the electronic circuit from the plurality of sub-imagers.

45. The method of claim 31, further comprising:
calculating a dose deposited in a patient from the incident radiation beam, the patient being disposed between a radiation source and the plurality of image layers.

46. A method for generating an image from a radiation beam, the method comprising:
receiving a plurality of radiation particles in an imaging device;
converting the plurality of radiation particles into a plurality of photons;
converting the plurality of photons into a plurality of electron hole-pairs;
transferring the plurality of electron hole-pairs to a readout circuit;
generating an output in the readout circuit from the plurality of electron hole-pairs, the output comprising a plurality of sub-images generated by sub-imagers coupled to each of the plurality of image layers;
determining a selection of sub-images from the plurality of sub-images; and
combining the selection of sub-images to generate a data image,
wherein the imaging device comprises a scalable plurality of paired layers, each pair of layers comprising a converting layer and a sensor layer corresponding to the converting layer,
wherein the number of image layers comprising the plurality of vertically stacked image layers is scaled to correspond to a dosage of an application of the incident radiation beam.

47. The method of claim 46, wherein a converting layer comprises a scintillator layer.

48. The method of claim 47, wherein the converting the plurality of radiation particles into a plurality of photons is performed in the scintillator layer.

49. The method of claim 46, wherein at least one paired layer of the plurality of paired layers comprises an amorphous silicon (a-Si) photo diode array.

50. The method of claim 49, wherein the converting the plurality of photons into a plurality of electron hole-pairs is performed by the amorphous silicon (a-Si) photo diode array.

51. The method of claim 46, wherein at least one paired layer of the plurality of paired layers comprises an amorphous silicon (a-Si) thin film transistor array.

52. The method of claim 51, wherein the transferring the plurality of electron hole-pairs to a readout circuit is performed through the amorphous silicon (a-Si) thin film transistor array.

53. The method of claim 46, wherein at least one layer of the plurality of paired layers comprises an organic semiconductor transistor array.

54. The method of claim 53, wherein the converting of the plurality of photons into a plurality of electron hole-pairs is performed by the organic semiconductor photo diode array.

55. the method of claim 46, wherein at least one layer of the plurality of paired layers comprises an organic semiconductor transistor array.

56. The method of claim 55, wherein the transferring of the plurality of electron hole-pairs to a readout circuit is performed through the organic semiconductor transistor array.

57. The method of claim 56, wherein the readout circuit comprises an application-specific integrated circuit (ASIC).

58. The method of claim 46, wherein processing the output from the readout circuit to generate a data image comprises selectively collecting the sub-images from the plurality of sub-imagers.

59. The method of claim 46, wherein processing the output from the readout circuit to generate a data image comprises re-sampling and interpolating a plurality of sub-images.

* * * * *